US012324118B2

(12) United States Patent
Ke

(10) Patent No.: US 12,324,118 B2
(45) Date of Patent: Jun. 3, 2025

(54) SPLICING SCREEN AND DISPLAY DEVICE

(71) Applicant: TCL China Star Optoelectronics Technology Co., Ltd., Guangdong (CN)

(72) Inventor: Jhongciao Ke, Guangdong (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/770,293

(22) PCT Filed: Mar. 31, 2022

(86) PCT No.: PCT/CN2022/084408
§ 371 (c)(1),
(2) Date: Apr. 20, 2022

(87) PCT Pub. No.: WO2023/173500
PCT Pub. Date: Sep. 21, 2023

(65) Prior Publication Data
US 2024/0147637 A1    May 2, 2024

(30) Foreign Application Priority Data
Mar. 16, 2022   (CN) .......................... 202210261946.8

(51) Int. Cl.
*H05K 5/30*   (2025.01)
*H01L 25/16*   (2023.01)

(52) U.S. Cl.
CPC ............ *H05K 5/30* (2025.01); *H01L 25/167* (2013.01)

(58) Field of Classification Search
CPC ....... H05K 5/0021; H01L 25/167; G09F 9/33; G09F 9/3026
See application file for complete search history.

(56) References Cited

U.S. PATENT DOCUMENTS

| 11,764,195 | B2* | 9/2023 | Huo | .................... | G11C 19/287 |
| | | | | | 345/690 |
| 11,862,051 | B2* | 1/2024 | Wang | .................... | H10H 29/142 |
| 11,887,842 | B2* | 1/2024 | Tseng | .................. | H01L 25/0753 |
| 12,066,705 | B2* | 8/2024 | Fan | .......................... | G09F 9/35 |
| 2017/0351475 | A1 | 12/2017 | Meersman et al. | | |
| 2021/0358347 | A1* | 11/2021 | Jiang | ...................... | G09F 9/33 |

(Continued)

FOREIGN PATENT DOCUMENTS

| CN | 204423833 | 6/2015 |
| CN | 107742480 | 2/2018 |

(Continued)

*Primary Examiner* — Vinh T Lam

(57) ABSTRACT

The present application discloses a splicing screen and a display device, which relates to a technical field of display. In technical solutions provided by the present application, structures of a first unit panel and a second unit panel that are mutually spliced in the splicing screen are improved. A first light-emitting device layer defining a display area AA thereof in the first unit panel overlaps a non-display area of the second unit panel for displaying, so as to visually eliminate or weaken visual influence of the non-display area on the splicing screen, lift restriction of the non-display area NA on spacing between adjacent pixel units of different unit panels in the splicing screen, and improve visual senses of the splicing screen.

19 Claims, 7 Drawing Sheets

(56) References Cited

U.S. PATENT DOCUMENTS

2021/0407974 A1\* 12/2021 Jiang ................... H10K 59/18
2022/0052022 A1     2/2022 Yu
2022/0343810 A1\* 10/2022 Kim ................... H10H 29/142
2024/0015898 A1\*  1/2024 Jiang ................... H05K 5/30
2024/0019727 A1\*  1/2024 Zheng ............... G02F 1/133388

FOREIGN PATENT DOCUMENTS

| CN | 108777114 | 11/2018 |
| CN | 109300952 | 2/2019 |
| CN | 113470538 | 10/2021 |
| CN | 214752699 | 11/2021 |
| WO | WO 2016/110483 | 7/2016 |

\* cited by examiner

SPLICING SCREEN AND DISPLAY DEVICE

RELATED APPLICATIONS

This application is a National Phase of PCT Patent Application No. PCT/CN2022/084408 having International filing date of Mar. 31, 2022, which claims the benefit of priority of Chinese Patent Application No. 202210261946.8 filed on Mar. 16, 2022. The contents of the above applications are all incorporated by reference as if fully set forth herein in their entirety.

FIELD AND BACKGROUND OF THE INVENTION

The present application relates to a technical field of display, and in particular, to a splicing screen and a display device.

With the development of electronic display products, consumers' pursuit of visual senses of products has become more and more intense. In conventional display panels, due to technical limitations, splicing joints will be formed between two unit panels spliced together, which will affect visual sense of an user and reduce visual screen proportion of a splicing screen, especially when there is a non-display area where two unit panels are spliced together, the non-display area will limit distance between adjacent pixel units of different unit panels in the splicing screen and enlarge size of the splice joints, thus further affecting visual sense of the splicing screen.

A technical problem to be solved by the present application is to provide a new splicing screen and a display device.

SUMMARY OF THE INVENTION

Technical solutions adopted by the present application to solve the above technical problem are as follows:

In a first aspect, the present application provides a splicing screen, comprising:
 a plurality of unit panels that are mutually spliced, wherein the plurality of unit panels comprise at least a group of first unit panel and second unit panel that are mutually spliced, the first unit panel comprises a first light-emitting device layer defining a display area thereof, the second unit panel comprises a non-display area disposed at least on one side of the display area close to the first unit panel, and the first light-emitting device layer extends and overlaps the non-display area of the second unit panel.

Optionally, in some embodiments of the present application, the first unit panel comprises a first array substrate, the first light-emitting device layer is disposed on the first array substrate, the first light-emitting device layer comprises an extension portion extending to an outer side of one side edge of the first array substrate, and the extension portion overlaps the non-display area of the second unit panel.

Optionally, in some embodiments of the present application, the non-display area of the second unit panel comprises a binding area, the second unit panel comprises a chip on film, the chip on film is bound on the binding area, and the extension portion laps over one side of the chip on film facing away from the second unit panel.

Optionally, in some embodiments of the present application, a holding opening extending in a positive direction is formed on the extending portion facing the chip on film, and the holding opening at least partially holds the chip on film.

Optionally, in some embodiments of the present application, a splicing gap is formed between the first unit panel and the second unit panel, and the chip on film is bent into the splicing gap.

Optionally, in some embodiments of the present application, an outer wall of the extension portion comprises a lap wall and a limit wall disposed at an included angle, the lap wall and the limit wall define the holding opening, the extension portion is lapped over the chip on film through the lap wall, and the limit wall abuts against a portion of the chip on film facing a side portion of the first unit panel.

Optionally, in some embodiments of the present application, an extension depth of the holding opening in the positive direction is configured such that display surfaces of the first unit panel and the second unit panel are flush with each other.

Optionally, in some embodiments of the present application, the first light-emitting device layer comprises a plurality of first bead plates sequentially disposed on the first array substrate and having at least one first pixel unit.

Optionally, in some embodiments of the present application, the first bead plate comprises extension bead plates, and the extension bead plates partially extend to the outer side of one side edge of the first array substrate to define the extension portion.

Optionally, in some embodiments of the present application, a pin portion is disposed on the first bead plates, each of the first pixel units comprises at least one first light-emitting chip electrically connected to the pin portion, and the pin portion is electrically connected to the first array substrate.

Optionally, in some embodiments of the present application, the first pixel unit comprises a plurality of the first light-emitting chips, a first electrode of each of the first light-emitting chips is connected to a first node, the pin portion comprises a common pin electrically connected to the first node, and independent pins with a number corresponding to a number of the first light-emitting chips and electrically connected to a second electrode of each of the first light-emitting chips.

Optionally, in some embodiments of the present application, the first electrode is an anode and the second electrode is a cathode.

Optionally, in some embodiments of the present application, the first electrode is a cathode and the second electrode is an anode.

Optionally, in some embodiments of the present application, the pin portion of the extension bead plate is disposed on a portion of the extension bead plate inside the side edge of the first array substrate.

Optionally, in some embodiments of the present application, the second unit panel comprises a second array substrate and a second light-emitting device layer defining a display area thereof, the second light-emitting device layer comprises a plurality of second bead plates sequentially disposed on the second array substrate, and the second bead plate is provided with at least one second pixel unit.

Optionally, in some embodiments of the present application, spacings between adjacent first pixel units, between adjacent second pixel units, and between adjacent first pixel unit and second pixel unit are consistent in a direction from the first unit panel to the second unit panel.

Optionally, in some embodiments of the present application, the spacings between adjacent first pixel units, between adjacent second pixel units, and between adjacent first pixel unit and second pixel unit are 625 μm.

In a second aspect, the present application provides a display device, comprising:
the splicing screen as described in the first aspect; and
a main body on which the splicing screen is disposed.

Compared with the prior art, the present application has the following advantages:

According to the splicing screen and the display device provided in the present application, structures of the first unit panel and the second unit panel which are spliced with each other in the splicing screen are improved. A first light-emitting device layer defining a display area thereof in the first unit panel overlaps a non-display area of the second unit panel for displaying, so as to visually eliminate or weaken visual influences of the non-display area on the splicing screen, lift restriction of the non-display area on spacing between adjacent pixel units of different unit panels in the splicing screen, and improve visual senses of the splicing screen.

BRIEF DESCRIPTION OF THE SEVERAL VIEWS OF THE DRAWINGS

In order to more clearly describe the technical solutions in embodiments of the present application or technical solutions in the prior art, hereinafter, the appended drawings used for describing the embodiments will be briefly introduced. The appended drawings described below are only directed to some embodiments of the present application, and for a person skilled in the art, without expenditure of creative labor, other drawings can be derived on the basis of these appended drawings.

Figure 1:
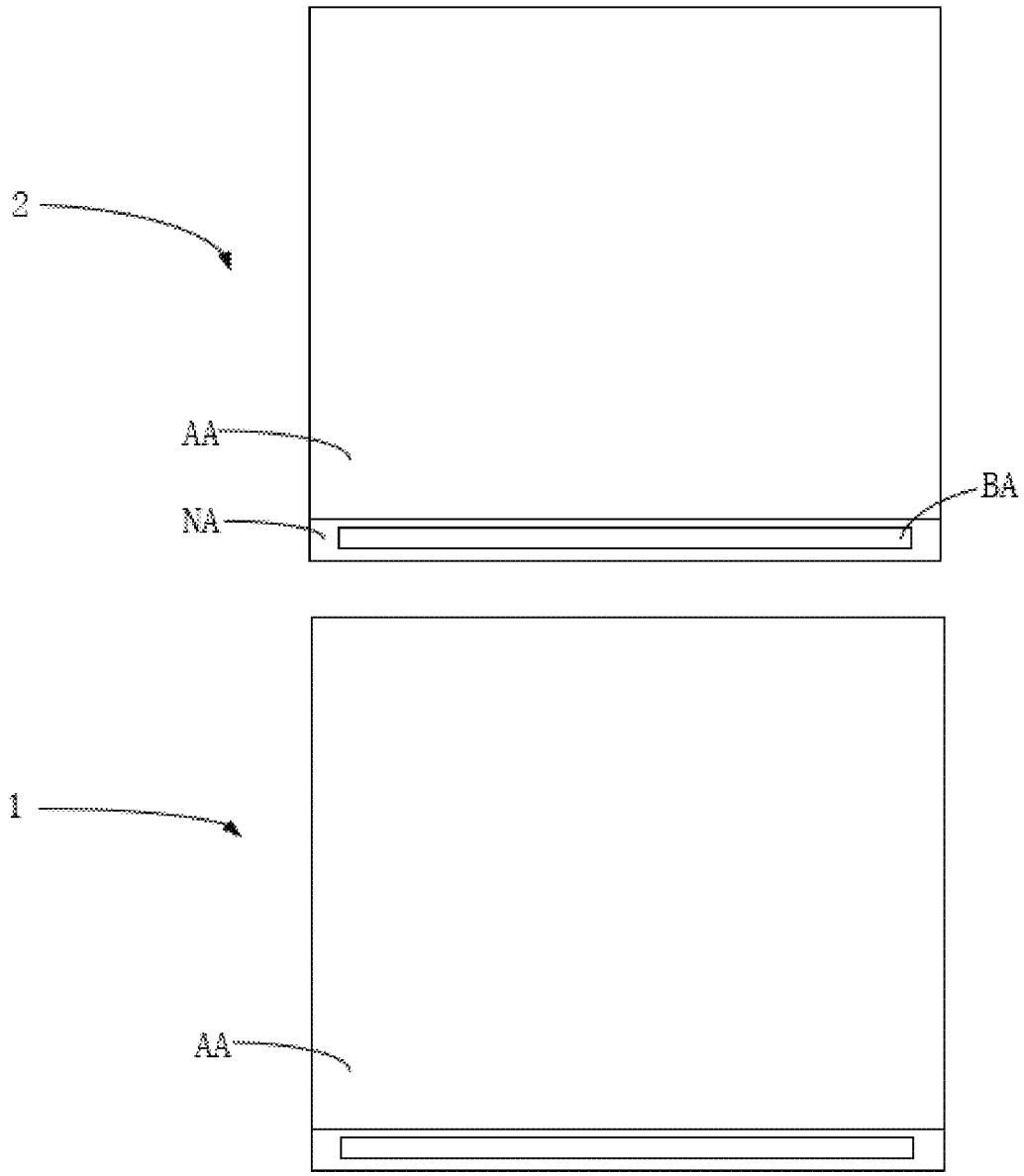
FIG. 1 is a schematic structural diagram of a unit panel included in a splicing screen before splicing according to Embodiment 1 of the present application.

DESCRIPTION OF REFERENCE NUMERALS 1-first unit panel, 11-first light-emitting device layer, 11a-extension portion, 12-holding opening, 12a-lap wall, 12b-limit wall, 13-first array substrate, 14-first bead plate, 14a-extension bead plate, 14b-inner bead plate, 15-first pixel unit, 16-pin portion, 16a-common pin, 16b-independent pin; 2-second unit panel, 21-chip on film, 22-second light-emitting device layer, 23-second array substrate, 24-second bead plate, 25-second pixel unit, 26-binding pad, AA-display area, NA-non-display area, BA-binding area.

DESCRIPTION OF SPECIFIC EMBODIMENTS OF THE INVENTION

Embodiments

Hereinafter, technical solutions in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In description of the present application, it should be understood that the terms "center", "longitudinal", "horizontal", "length", "width", "thickness", "upper", "lower", "before", "after", "left", "right", "vertical", "horizontal", "top", "bottom", "inner", "outer" etc., that indicating an orientation or a positional relationship are based on an orientation or a positional relationship shown in the accompanying drawings, which are merely intended to facilitate the description of the present application and simplify the description, and are not intended to indicate or imply that a device or an element must have a specific orientation, be constructed and operated in a specific orientation, and therefore cannot be construed as a limitation of the present application. In addition, the terms "first," "second" are used for descriptive purposes only and cannot be understood as indicating or implying relative importance or implicitly indicating the number of indicated technical features. Thus, the features defined by "first" and "second" may explicitly or implicitly include one or more features. In description of the present application, "a plurality of" means two or more, unless specifically limited otherwise.

In the present application, the term "exemplary" means "used as an example, illustration, or description". Any embodiments described as exemplary in the present application are not necessarily interpreted as being more preferred or advantageous than other embodiments. In order to enable any person skilled in the art to realize and use the present application, the following description is given. In the following description, details are given for purposes of explanation. It should be understood that a person skilled in the art may recognize that the present application may be implemented without using these specific details. In other instances, known structures and processes are not described in detail to avoid unnecessary details obscuring the description of the present application. Accordingly, the present application is not intended to be limited to the illustrated embodiments, but is to be corded the widest scope consistent with the principles disclosed herein.

Embodiment 1

Figure 2:
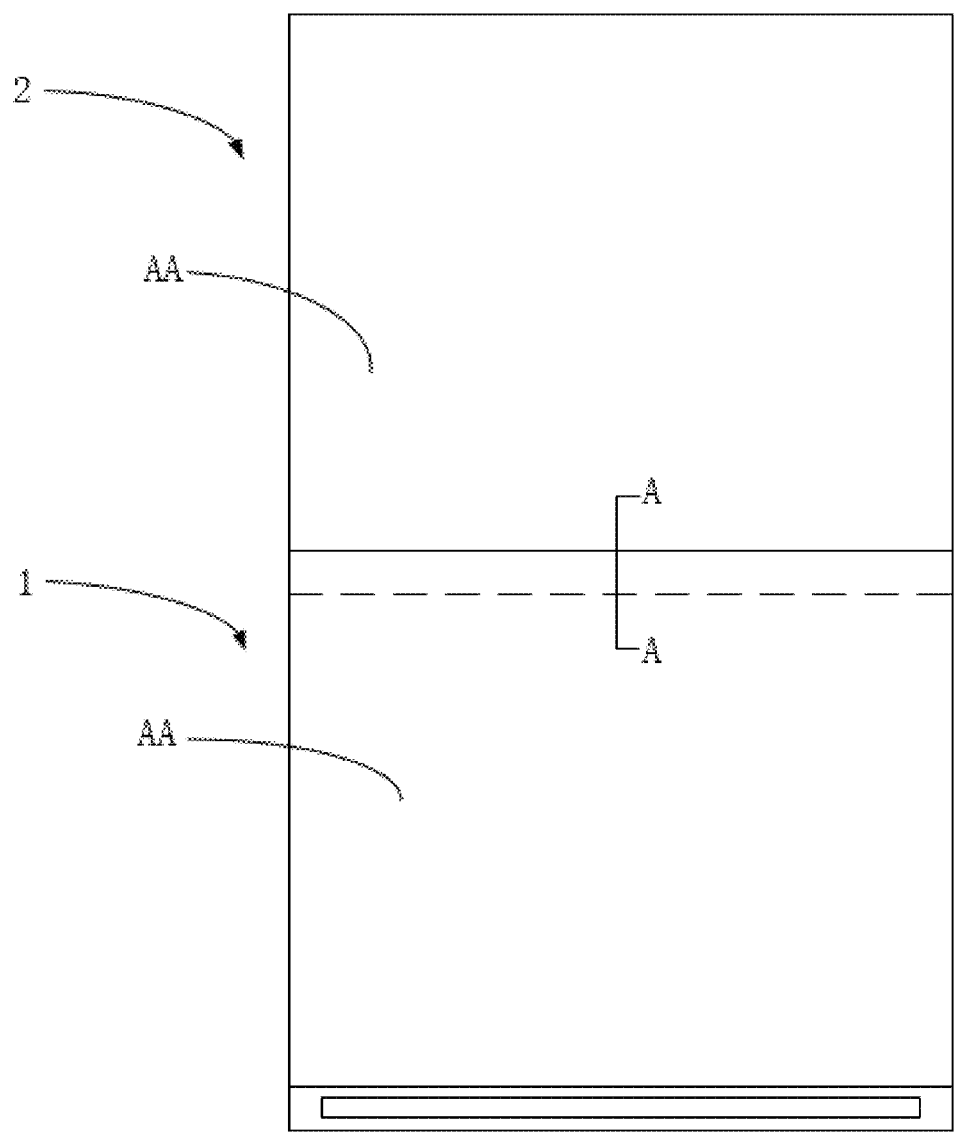
FIG. 2 is a schematic structural diagram of a splicing screen according to Embodiment 1 of the present application.
Figure 3:
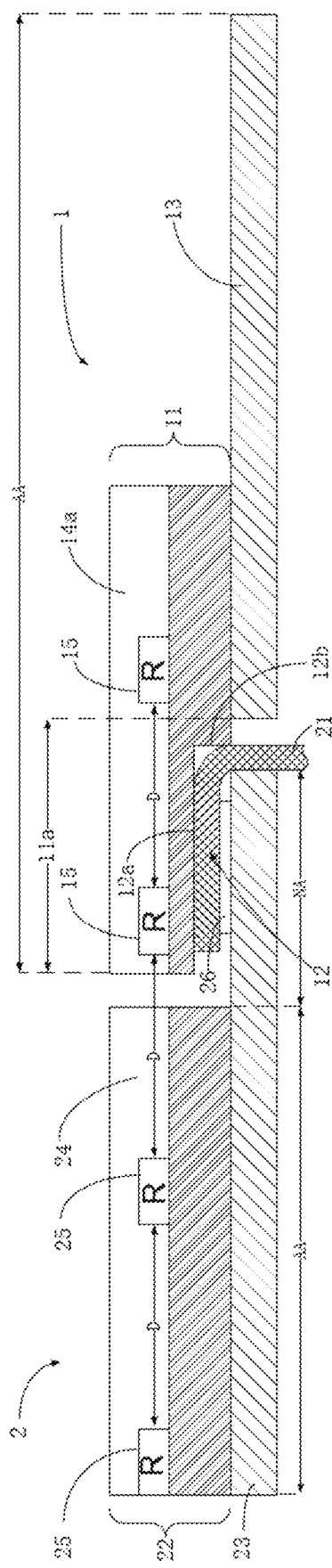
FIG. 3 is a schematic cross-sectional view at A-A of FIG. 2.

A main body of this embodiment is a splicing screen. Referring to FIGS. 1, 2 and 3, which are respectively a schematic structural diagram of a unit panel included in a splicing screen before splicing in this embodiment, a schematic structural diagram of a splicing screen in this embodiment, and a schematic cross-sectional view at A-A of FIG. 2.

It can be seen that, in this embodiment, the splicing screen comprises:

a plurality of unit panels that are mutually spliced, wherein the plurality of unit panels comprise at least a group of first unit panel 1 and second unit panel 2 that are mutually spliced, the first unit panel 1 comprises a first light-emitting device layer 11 defining a display area thereof, the second unit panel 2 comprises a non-display area NA disposed at least on one side of the display area AA close to the first unit panel 1, and the first light-emitting device layer 11 extends and overlaps the non-display area NA of the second unit panel 2.

The splicing screen provided in this embodiment is provided with the first unit panel 1 and the second unit panel 2 that are spliced together. The first light-emitting device layer 11 defining a display area AA thereof in the first unit panel 1 overlaps a non-display area NA of the second unit panel 2 for displaying, so as to visually eliminate or weaken visual influence of the non-display area NA on the splicing screen, lift restriction of the non-display area NA on spacing between adjacent pixel units of different unit panels in the splicing screen, and improve visual senses of the splicing screen, which is conducive to realizing a seamless splicing screen with a spacing of less than 0.7 µm between pixel units.

Referring to FIG. 3 again, in this embodiment, the first light-emitting device layer 11 serves as a member defining the display area AA of the first unit panel 1, the first light-emitting device layer 11 extends directly from the first unit panel 1 to the non-display area NA of the second unit panel 2, and a picture displayed by the first light-emitting device layer 11 in the non-display area NA of the second unit panel 2 can be directly driven and controlled by the first unit panel 1, thereby effectively simplifying the driving and controlling mode of a displayed picture at splicing joints of the splicing screen.

It should be noted herein that the above-mentioned unit panel refers to a unit screen that forms a portion of a splicing screen and can be independently displayed. In addition, as shown in FIG. 2, in this embodiment, the splicing screen is composed of two unit panels as a whole. As described above, it is not proper to understand that the splicing screen can be composed of only two unit panels, or all unit panels in the splicing screen must be the first unit panel 1 and the second unit panel 2. On the premise of not affecting purpose of the invention, an implementer may adjust the number of unit panels included in the splicing screen and the splicing mode between each unit panel. It can be understood that as long as there is at least one group of the first unit panel 1 and the second unit panel 2 connected in a manner described above among a plurality of unit panels that are mutually spliced, technical effects of eliminating or weakening visual influences of the non-display area NA on the splicing screen can be achieved. For example, in another embodiment, a splicing screen specifically comprises four unit panels, wherein there are two unit panels which respectively constitute the first unit panel 1 and the second unit panel 2 described above, and remaining unit panels are spliced in a conventional manner.

In addition, it should be noted that, for the first unit panel 1 and the second unit panel 2 described above, an implementer may dispose the first unit panel 1 and the second unit panel 2 to have the same structure as shown in this embodiment. An implementer may also dispose the first unit panel 1 and the second unit panel 2 to have different structures. For example, in another embodiment, the first unit panel 1 is specifically a mirco LED display panel, and the second unit panel 2 is a mini LED display panel.

In addition, the first light-emitting device layer 11 mainly refers to a film layer member for performing light-emitting displaying in the first unit panel 1. The first light-emitting device layer 11 comprises a pixel unit, which defines a range of the display area AA of the first unit panel 1. The first light-emitting device layer 11 may be a mirco LED light-emitting device layer or a mini LED light-emitting device layer. In addition, as described above, the first light-emitting device layer 11 overlaps the non-display area NA of the second unit panel 2, that is, the first light-emitting device layer 11 partially covers and shields the non-display area NA of the second unit panel 2 in a positive direction, thereby emitting light and displaying. It should be noted that the positive direction refers to a direction perpendicular to display surfaces of the splicing screen.

Further referring to FIG. 3 again, in this embodiment, the first unit panel 1 comprises a first array substrate 13, the first light-emitting device layer 11 is disposed on the first array substrate 13, the first light-emitting device layer 11 comprises an extension portion 11a extending to an outer side of one side edge of the first array substrate 13, and the extension portion 11a overlaps the non-display area NA of the second unit panel 2. The extension portion 11a extends to an outer side of the first array substrate 13, thereby forming a protruding structure, which is convenient for overlapping of the first light-emitting device layer 11 with the non-display area NA on the second unit panel 2, and display surfaces of the first unit panel 1 and the second unit panel 2 are easier to be kept flush when configurations of the two are the same.

Further referring to FIGS. 1, 2 and 3 again, for a unit panel, a bonding area BA is generally provided, and a bonding pad 26 in the bonding area BA is electrically connected to a drive IC (not shown in the figures) through a chip on film 21. According to the different positions of the binding area BA on the unit panel, binding methods can be divided into front binding, side binding and back binding. In this embodiment, the second unit panel 2 adopts a narrow binding, that is, the binding area BA is disposed in the non-display area NA.

In order to reduce influence of a binding structure on overlapping effects of the extension portion 11a, the extension portion 11a can be stably overlapped on the non-display area NA of the second unit panel 2. In this embodiment, the extension portion 11a laps over one side of the chip on film 12 facing away from the second unit panel 2.

Referring to FIG. 3 again, for the above technical solutions, since the extension portion 11a laps over one side of the chip on film 12 in a partially superimposed shape, there may be a certain height difference between surfaces of the display area AA of the first unit panel 1 and the second unit panel 2 under influence of thickness of the chip on thin film 21, which may affect displaying effects of the splicing screen.

Accordingly, in this embodiment, the extension portion 11a is concavely formed with a holding opening 12 for holding the chip on film 21. By disposing the holding opening 12, influence of thickness of the chip on film 21 on lapping effects of the extension 11a can be reduced, and surfaces of the display area of the first unit panel 1 and the second unit panel 2 can be kept flush more easily. Ideally, an extension depth of the holding opening 12 in the positive direction is configured such that display surfaces of the first unit panel 1 and the second unit panel 2 are flush with each other. Of course, an implementer may also dispose other depths of the holding opening 12 to weaken influence of thickness of the chip on film 21 on lapping effects of the extension 11a. The holding opening 12 is not limited to realize the fact that display surfaces of the first unit panel 1 and the second unit panel 2 must be flush with each other.

Further referring to FIG. 3. In this embodiment, a splicing gap is formed between the first unit panel 1 and the second unit panel 2, and the chip on film 21 is bent into the splicing gap. In order to further improve contact stability between the extension portion 11a and the chip on film 21, in this embodiment, an outer wall of the extension portion 11a comprises a lap wall 12a and a limit wall 12b disposed at an included angle, the lap wall 12a and the limit wall 12b define the holding opening 12, the extension portion 11a is lapped over the chip on film 21 through the lap wall 12a, and the limit wall 12b abuts against a portion of the chip on film 21 facing a side portion of the first unit panel 1. The first unit panel 1 and the second unit panel 2 can be laterally limited to a certain extent by abutting the limiting wall 12b against the flip-chip film 21, so that the extension 11a can be more stably lapped over the flip-chip film 21, which is particularly applicable to a case where the lap wall 12a and the chip on film 21 are not directly fixed to each other.

Specific structures of the first unit panel 1 and the second unit panel 2 will be further disclosed below. As described above, the first light-emitting device layer 11 may be a structural layer including a micro LED light-emitting device, or may be a structural layer including a mini LED light-emitting device. However, if a structure provided in a conventional manner is adopted, the first array substrate 13 may be partially cut off when forming the extension portion 11a, so that the extension portion 11a can extend to an outer side of one side edge of the first array substrate, which will increase manufacturing difficulty of the first unit panel 1.

Figure 4:
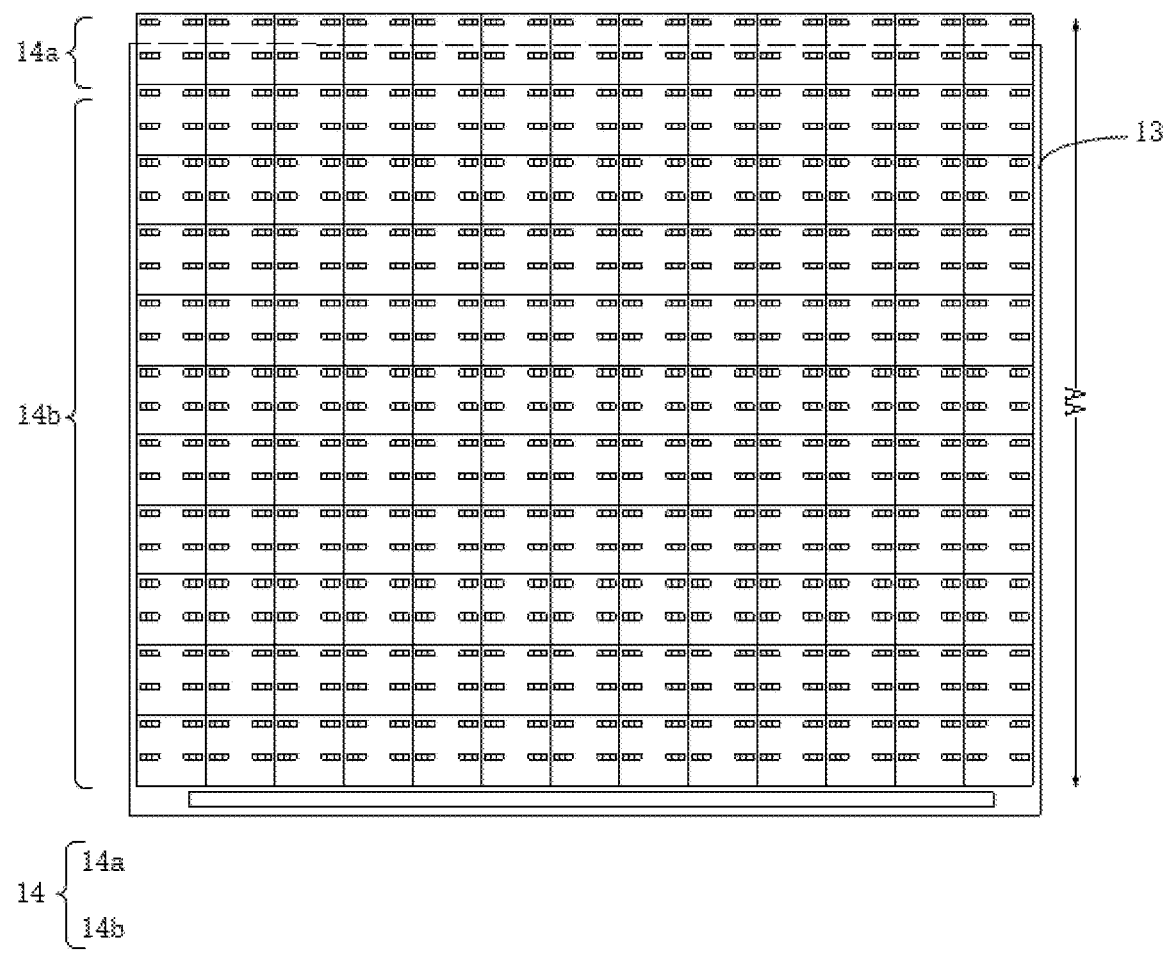
FIG. 4 is a schematic structural diagram of a first unit panel according to Embodiment 1 of the present application.
Figure 5:
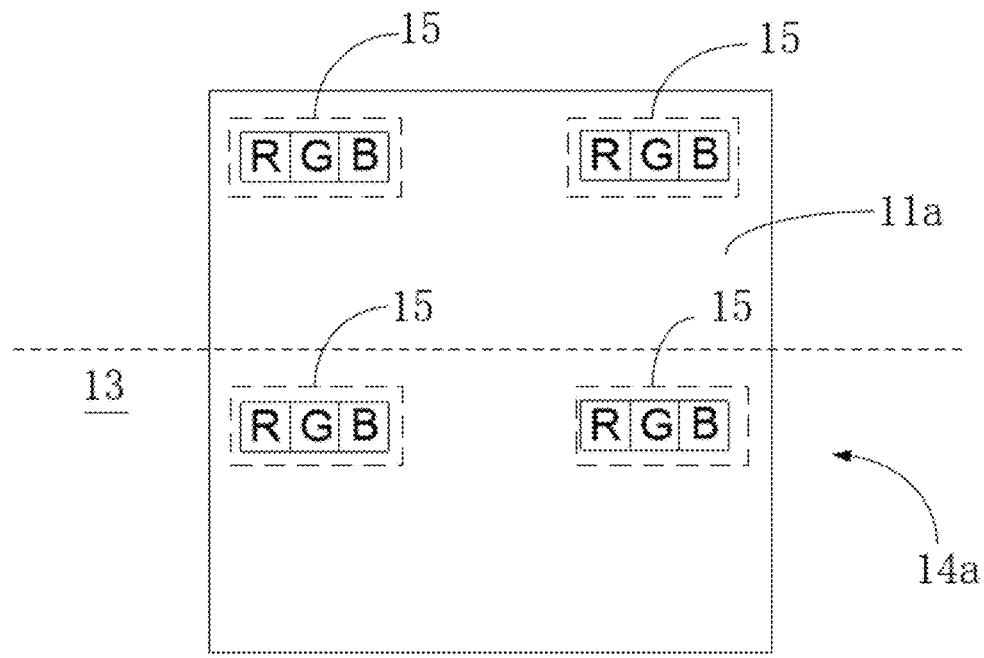
FIG. 5 is a schematic diagram of disposing a first pixel unit on extension bead plates according to Embodiment 1 of the present application.

Accordingly, referring to FIGS. 3, 4 and 5, it can be seen that, in this embodiment, the first light-emitting device layer 11 comprises a plurality of first bead plates 14 sequentially disposed on the first array substrate 13 and having at least one first pixel unit 15. The first bead plate 14 comprises extension bead plates 14a, and the extension bead plates 14a partially extend to the outer side of one side edge of the first array substrate 13 to define the extension portion 11a. Compared with first light-emitting device layer 11 with other structures, the extension portion 11a is formed by using the extension bead plates 14a, so that connection stability between the extension portion 11a and the first array substrate 13 can be ensured. In the process of disposing the extension bead plates 14a, only a portion of the extension bead plates 14a needs to be dispose inside one side edge of the first array substrate 13, and remaining extension bead plates 14a can be suspended to extend to an outer side of one side edge of the first array substrate 13, so that the extension portion 11a can be naturally formed. In this way, molding process of the extension portion 11a does not involve a cutting process of the first array substrate 13, and it is more easily to be realized in process.

It should be noted herein that the first bead plate 14 may be shown in FIG. 4, and further comprises inner bead plates 14b disposed on one side of the extension bead plates 14a facing away from the second unit panel 2, and each of the first bead plates 14 is disposed in an array on the first array substrate 13. It should be noted that this is not properly understood as a limitation on set mode of the first bead plate 14 or the first unit panel 1. The first bead plate 14 may comprise only the extension bead plates 14a, or may be disposed on the first array substrate 13 in a non-array manner. Meanwhile, the first light-emitting device layer 11 of the first unit panel 1 may include other structures, which can be selected by implementers according to their own needs on the premise of not affecting the purpose of the invention.

Figure 6:
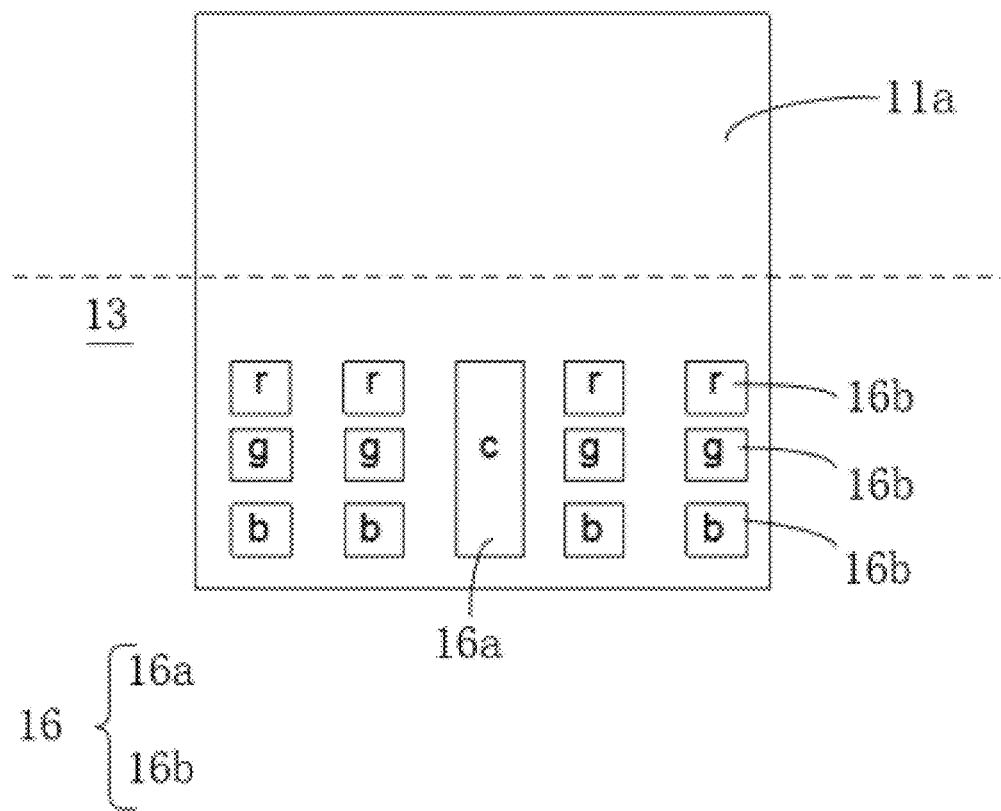
FIG. 6 is a schematic diagram of disposing a pin portion on extension bead plates according to Embodiment 1 of the present application.
Figure 7:
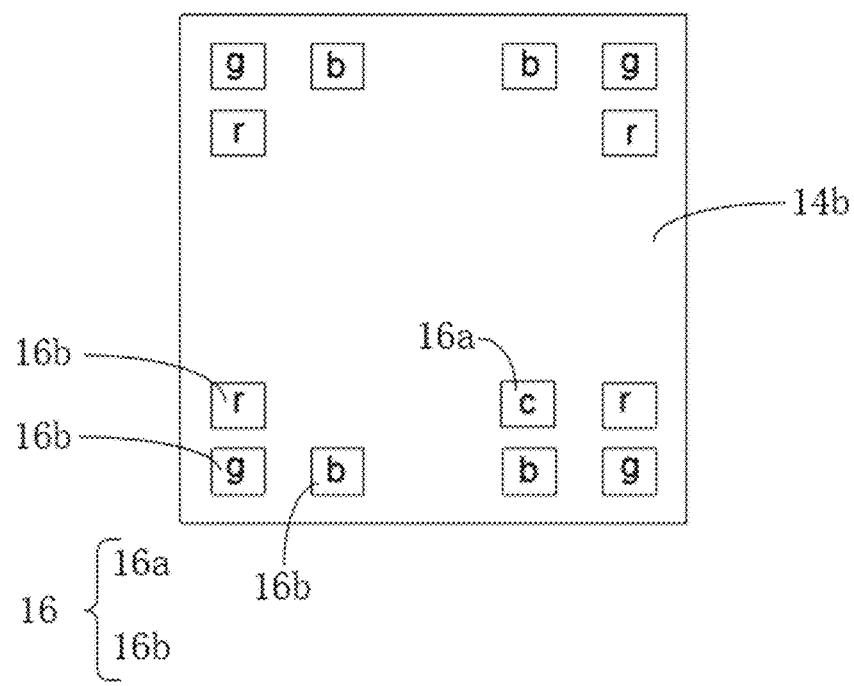
FIG. 7 is a schematic diagram of a pin portion on an inner extension bead plates according to Embodiment 1 of the present application.

Regarding driving mode of the first bead plate 14, please refer to FIGS. 5, 6, and 7. In this embodiment, a pin portion 16 is disposed on the first bead plates 14, each of the first pixel units 15 comprises at least one first light-emitting chip electrically connected to the pin portion 16, and the pin portion 16 is electrically connected to the first array substrate 13. As described above, the first pixel unit 15 refers to a unit for displaying pixel points. It can be known from FIG. 5 that, in this embodiment, each first pixel unit 15 specifically comprises three first light-emitting chips, namely, a red light-emitting chip R that emits a red light, a green light-emitting chip G that emits a green light, and a blue light-emitting chip B that emits a blue light. The red light-emitting chip R, the green light-emitting chip G, and the blue light-emitting chip B are combined to emit lights, so that the first pixel unit 15 emits a white light.

Certainly, the foregoing description should not be understood as a limitation on structure of the first bead plate 14. An implementer may further deform structure of the first bead plate 14, for example, so that each first pixel unit 15 comprises only a blue light-emitting chip B and a green light-emitting chip G, and the first pixel unit 15 emits a white light by disposing a red fluorescent layer on the first bead plate 14 and encapsulating the blue light-emitting chip B and the green light-emitting chip G. It should be noted that, in this embodiment, the first light-emitting chip is specifically a micro led light-emitting chip, and the first pixel unit may be used as a backlight of the splicing screen, or may be directly displayed by self-emitting of the chip.

As for set mode of the pin portions 16 on the extension bead plates 14a, as shown in FIGS. 4 and 5, since the extension bead plates 14a partially extend to the outer side of one side edge of the first array substrate 13, difficulty of disposing the pin portions 16 on the extension bead plates 14a will be increased. Accordingly, referring to FIG. 6, which is a schematic diagram of disposing pin portions 16 on extension bead plates 14a. The viewing angle of FIG. 6 is parallel to the positive direction and extends from the first array substrate 13 to the extension bead plate 14a. It can be seen that in this embodiment, the pin portions 16 of the extension bead plate 14a are all disposed on a portion of the extension bead plate inside the side edge of the first array substrate 13 and connected to the first array substrate 13, so that the pin portions 16 of the extension bead plate 14a can be directly electrically connected with the first array substrate 13, thus additional wiring structures extending to outside of the first array substrate 13 can be avoided.

For the inner bead plates 14b, an implementer may select set mode of the pin portions 16 according to an actual situation, which is not particularly limited in the present application. An ideal set mode is shown in FIG. 7, where viewing angle is parallel to the positive direction and extends from the first array substrate 13 to the inner bead plates 14b. It can be seen that the pin portions 16 are disposed on a portion where the inner bead plates 14b are in contact with the first array substrate 13 and surrounds center of the inner bead plates 14b.

In more detail, please refer to FIGS. 6 and 7. In this embodiment, in order to simplify set of the pin portions 16, the first pixel unit 15 comprises a plurality of first light emitting chips, a first electrode of each of the first light emitting chips is connected to a first node, the pin portion 16 comprises a common pin 16a electrically connected to the first node, and an independent pin 16b corresponding to a number of the first light emitting chips and electrically connected to a second electrode of each of the first light emitting chips.

In detail, in the embodiment, the common pin 16a is specifically used to connect to cathodes of each first light emitting chip, and the independent pins 16b are used to connect to anodes of the corresponding first light-emitting chips. An independent pin 16b comprises a red chip pin r used to electrically connect to anode of the red light-emitting chip R, a green chip pin g used to electrically connect to anode of the green light-emitting chip G, and a blue chip pin b used to electrically connect to anode of the blue light-emitting chip b.

It can be understood that an implementer can also connect the common pin 16a to anode of each first light-emitting chip, and connect the independent pin 16b to cathode of a corresponding first light-emitting chip, which can also simplify structure of the pin portions 16.

Figure 8:
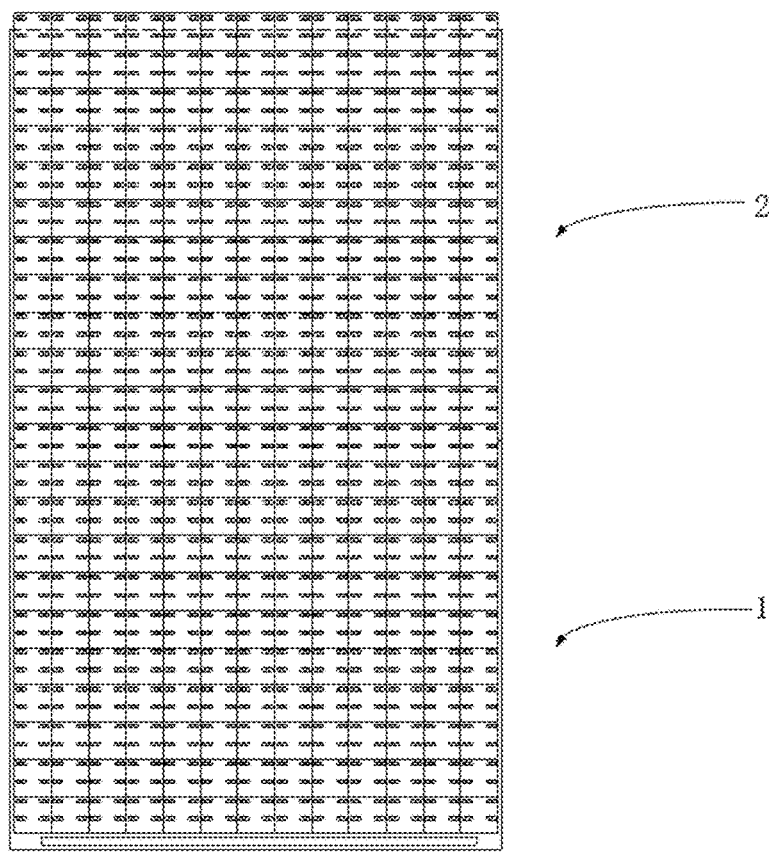
FIG. 8 is a schematic structural diagram of a splicing screen according to Embodiment 1 of the present application.

Furthermore, for the first bead plate 14, only one first pixel unit 15 may be included, or a plurality of first pixel units 15 may be collectively packaged as shown in FIG. 5. If it is desired to improve display effects of the splicing screen, it is necessary to keep the pixel units in the first unit panel 1 and the second unit panel 2 at a preset equidistant spacing. Therefore, referring to FIGS. 2, 3 and 8, in this embodiment, the second unit panel 2 comprises a second array substrate 23 and a second light emitting device layer 22 defining a display area AA thereof, the second light emitting device layer 22 comprises a plurality of second bead plates 24 sequentially disposed on the second array substrate 23, and the second bead plate 24 is disposed with at least one second pixel unit 25. The first pixel units 15 and the second pixel units 25 are disposed at equal intervals along a direction from the first unit panel 1 to the second unit panel 2. That is, a spacing D between adjacent first pixel units 15, between adjacent second pixel units 25, and between adjacent first pixel unit 15 and second pixel unit 25 is consistent in the direction from the first unit panel 1 to the second unit panel 2. The above-mentioned spacing D can be selected to be 625 μm, so that the splicing screen has higher resolution.

More specifically, referring to FIG. 5 again, in each first bead plate 14, four first pixel units 15 are collectively packaged, and the four first pixel units 15 are equally divided into two groups disposed at intervals in a direction from the first unit panel 1 to the second unit panel 2, and the two first pixel units 15 in each group are disposed at intervals along a lateral direction.

Embodiment 2

Figure 9:
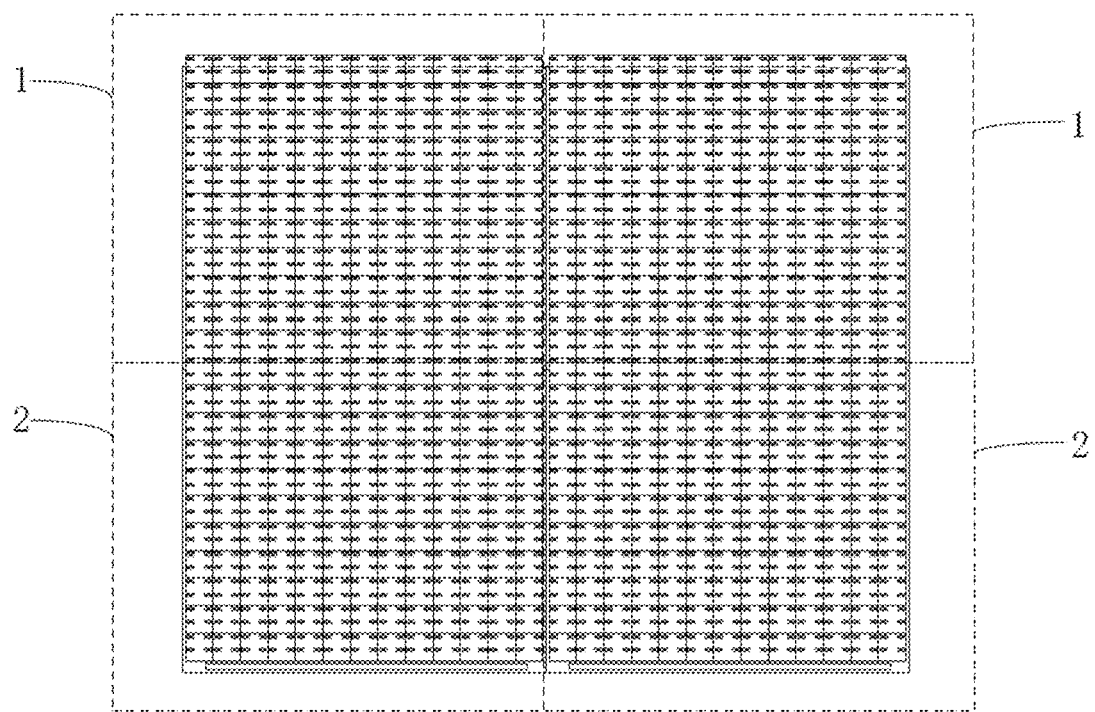
FIG. 9 is a schematic structural diagram of a splicing screen according to Embodiment 2 of the present application.

A main body of embodiment 2 is a splicing screen. Referring to FIG. 9, this embodiment differs from embodiment 1 in that the splicing screen specifically comprises four unit panels disposed in an array, the four unit panels are divided into two groups, and each group comprises a first unit panel 1 and a second unit panel 2 as described in embodiment 1. Unit panels in different groups are spliced in a common way.

Embodiment 3

A main body of embodiment 3 is a splicing screen comprising a splicing screen and a main body. The display device may be any display device such as an iPad, a mobile phone, a computer display, or a VR device. The above-described splicing screen may be the splicing screen as described in either Embodiment 1 or Embodiment 2, and the splicing screen is disposed on the main body. It should be noted here that the main body may be the whole or a part of the display device other than the display screen.

Having described the basic concepts above, it is obvious to those skilled in the art that the detailed disclosures above are by way of example only and do not constitute a limitation on the present application. Although not expressly stated herein, various modifications, improvements, and amendments may be made to the present application by those skilled in the art. Such modifications, improvements and amendments are proposed in the present application, so they remain within the spirit and scope of exemplary embodiments of the present application.

Meanwhile, specific words are used to describe embodiments of the present application. "One embodiment," "an embodiment," and/or "some embodiments" means a feature, structure, or characteristic related to at least one embodiment of the present application. It should therefore be emphasized and noted that "one embodiment" or "an embodiment" or "an alternative embodiment" mentioned twice or more in different places in the specification do not necessarily mean the same embodiment. In addition, some features, structures or characteristics in one or more embodiments of the present application may be combined appropriately.

Similarly, it should be noted that, in order to simplify description of the disclosure of the present application and thereby facilitating understanding of one or more of embodiments in the present application, various features are sometimes incorporated into one embodiment, drawings, or descriptions thereof in the foregoing description of embodiments in the present application. However, this disclosure method does not mean that subject of the present application requires more features than those mentioned in the claims. In fact, features of the embodiments are less than the overall features of an individual embodiment disclosed above.

Numbers describing the number of components and attributes are used in some embodiments, and it should be understood that such numbers are used for description of embodiments, and in some examples modifiers "about", "approximately" or "substantially" are used. Unless otherwise stated, "about", "approximately" or "substantially" indicates that the number is allowed to vary by ±%. Accordingly, in some embodiments, the numerical parameters used in the specification and claims are approximate values that may vary depending on desired characteristics of an individual embodiment. In some embodiments, specified significant digits should be taken into account for numerical parameters, and a method of general digit retention should be adopted. Although the numerical ranges and parameters used in some embodiments of the present application to confirm their breadth are approximate values, in specific embodiments, set of such values is as accurate as possible, within feasible range.

Each of the patents, patent applications, patent application publications, and other materials, such as articles, books, specifications, publications, documents, etc. cited in the present application are hereby incorporated by reference as a whole, except for historical documents of application which are inconsistent with or conflict with contents of the present application and for which the widest scope of claims in the present application is limited (currently or hereafter attached to the present application). It should be noted that, if there is any inconsistency or conflict between the descriptions, definitions and/or terms used in the supplementary materials of the present application and contents of the present application, descriptions, definitions and/or terms used in the present application shall prevail.

What is claimed is:

1. A splicing screen, comprising:
   a plurality of unit panels that are mutually spliced, wherein the plurality of unit panels comprise at least a group of first unit panel and second unit panel that are mutually spliced, the first unit panel comprises a first light emitting device layer defining a display area thereof, the first unit panel further comprises a first array substrate, the first light emitting device layer comprises an extension portion extending to an outer side of one side edge of the first array substrate, the second unit panel comprises a non-display area disposed at least on one side of the display area close to the first unit panel, the second unit panel further comprises a chip on film, and the first light emitting device layer extends and overlaps the non-display area of the second unit panel;
   wherein a holding opening extending in a positive direction is formed on the extending portion facing the chip on film, and the holding opening at least partially holds the chip on film.

2. The splicing screen according to claim 1, wherein the first light emitting device layer is disposed on the first array substrate, and the extension portion overlaps the non-display area of the second unit panel.

3. The splicing screen according to claim 1, wherein the non-display area of the second unit panel comprises a binding area, the chip on film is bound on the binding area, and the extension portion laps over one side of the chip on film facing away from the second unit panel.

4. The splicing screen according to claim 1, wherein a splicing gap is formed between the first unit panel and the second unit panel, and the chip on film is bent into the splicing gap.

5. The splicing screen according to claim 1, wherein an outer wall of the extension portion comprises a lap wall and a limit wall disposed at an included angle, the lap wall and the limit wall define the holding opening, the extension portion laps over the chip on film through the lap wall, and the limit wall abuts against a portion of the chip on film facing a side portion of the first unit panel.

6. The splicing screen according to claim 1, wherein an extension depth of the holding opening in the positive direction is configured such that display surfaces of the first unit panel and the second unit panel are flush with each other.

7. The splicing screen according to claim 1, wherein the first light emitting device layer comprises a plurality of first bead plates sequentially disposed on the first array substrate and having at least one first pixel unit.

8. The splicing screen according to claim 7, wherein the first bead plate comprises extension bead plates, and the extension bead plates partially extend to the outer side of one side edge of the first array substrate to define the extension portion.

9. The splicing screen according to claim 8, wherein a pin portion is disposed on the first bead plates, each of the first pixel units comprises at least one first light emitting chip electrically connected to the pin portion, and the pin portion is electrically connected to the first array substrate.

10. The splicing screen according to claim 9, wherein the first pixel unit comprises a plurality of the first light emitting chips, a first electrode of each of the first light emitting chips is connected to a first node, the pin portion comprises a common pin electrically connected to the first node, and independent pins with a number corresponding to a number of the first light emitting chips and electrically connected to a second electrode of each of the first light emitting chips.

11. The splicing screen according to claim 10, wherein the first electrode is an anode and the second electrode is a cathode.

12. The splicing screen according to claim 10, wherein the first electrode is a cathode and the second electrode is an anode.

13. The splicing screen according to claim 9, wherein the pin portion of the extension bead plate is disposed on a portion of the extension bead plate inside the side edge of the first array substrate.

14. The splicing screen according to claim 8, wherein the second unit panel comprises a second array substrate and a second light emitting device layer defining a display area thereof, the second light emitting device layer comprises a plurality of second bead plates sequentially disposed on the second array substrate, and the second bead plate is provided with at least one second pixel unit.

15. The splicing screen according to claim 14, wherein spacings between adjacent first pixel units, between adjacent second pixel units, and between adjacent first pixel unit and second pixel unit are consistent in a direction from the first unit panel to the second unit panel.

16. The splicing screen according to claim 15, wherein the spacings between adjacent first pixel units, between adjacent second pixel units, and between adjacent first pixel unit and second pixel unit are 625 μm.

17. A display device, comprising:
    the splicing screen according to claim 1; and
    a main body on which the splicing screen is disposed.

18. The splicing screen according to claim 13, wherein each of the plurality of first bead plates further comprises an inner bead plate disposed on one side of the extension bead plate facing away from the second unit panel, and the plurality of first bead plates are disposed in an array on the first array substrate.

19. A splicing screen, comprising:
    a plurality of unit panels that are mutually spliced, wherein the plurality of unit panels comprise at least a group of first unit panel and second unit panel that are mutually spliced, the first unit panel comprises a first light emitting device layer defining a display area thereof, the first unit panel further comprises a first array substrate, the second unit panel comprises a non-display area disposed at least on one side of the display area close to the first unit panel, and the first light emitting device layer extends and overlaps the non-display area of the second unit panel;
    wherein the first light emitting device layer comprises a plurality of first bead plates sequentially disposed on the first array substrate and having at least one first pixel unit.

* * * * *